United States Patent
Yang et al.

(10) Patent No.: US 11,928,068 B2
(45) Date of Patent: Mar. 12, 2024

(54) METHOD AND APPARATUS FOR DECODING OSCILLOSCOPE SIGNAL AND OSCILLOSCOPE

(71) Applicant: AUTEL INTELLIGENT TECHNOLOGY CORP., LTD., Guangdong (CN)

(72) Inventors: Liangliang Yang, Guangdong (CN); Xianchong Zhou, Guangdong (CN)

(73) Assignee: AUTEL INTELLIGENT TECHNOLOGY CORP., LTD., Guangdong (CN)

( * ) Notice: Subject to any disclaimer, the term of this patent is extended or adjusted under 35 U.S.C. 154(b) by 865 days.

(21) Appl. No.: 16/918,238

(22) Filed: Jul. 1, 2020

(65) Prior Publication Data
US 2020/0334189 A1 Oct. 22, 2020

Related U.S. Application Data

(63) Continuation of application No. PCT/CN2019/070471, filed on Jan. 4, 2019.

(30) Foreign Application Priority Data

Jan. 5, 2018 (CN) .......................... 201810010433.3

(51) Int. Cl.
*G06F 13/42* (2006.01)
*G01R 13/02* (2006.01)
(Continued)

(52) U.S. Cl.
CPC ......... *G06F 13/42* (2013.01); *G01R 13/0272* (2013.01); *H04L 43/0888* (2013.01); *H04L 69/18* (2013.01); *G06F 2213/0042* (2013.01)

(58) Field of Classification Search
CPC ............ G06F 13/42; G06F 2213/0042; G01R 13/0272; H04L 43/0888; H04L 69/18
(Continued)

(56) References Cited

U.S. PATENT DOCUMENTS 5,040,407 A * 8/1991 Hinckley ................ G01P 21/02
73/1.37
11,280,809 B2 * 3/2022 Yang ..................... G01R 13/029
(Continued)

FOREIGN PATENT DOCUMENTS

| CN | 102325129 A | 1/2012 |
|---|---|---|
| CN | 102355382 A | 2/2012 |

(Continued)

OTHER PUBLICATIONS

English translation of CN 103884890, Jun. 25, 2014. (Year: 2014).*

*Primary Examiner* — Michael P Nghiem

(57) ABSTRACT

Embodiments of the present invention relate to the technical field of oscilloscopes and disclose a method and an apparatus for decoding an oscilloscope signal and an oscilloscope. The method includes: obtaining a voltage signal; converting the voltage signal into a digital signal; determining whether the digital signal matches a decoding protocol; and if so, decoding the digital signal according to the decoding protocol, and outputting decoding result information. In the embodiments, the digital signal is decoded according to the decoding protocol, to generate the decoding result information without relying on a hardware device for decoding, so that when a new protocol is used for decoding, decoding compatibility may be improved without changes in hardware.

9 Claims, 8 Drawing Sheets

(51) Int. Cl.
*H04L 43/0888* (2022.01)
*H04L 69/18* (2022.01)

(58) Field of Classification Search
USPC .......................................................... 702/66
See application file for complete search history.

(56) References Cited

U.S. PATENT DOCUMENTS

| | | | | |
|---|---|---|---|---|
| 2012/0106618 A1* | 5/2012 | Kudo | ................ | H04L 27/2672 |
| | | | | 375/232 |
| 2013/0209093 A1* | 8/2013 | Tanimura | ........... | H04B 10/0775 |
| | | | | 398/32 |
| 2014/0334828 A1* | 11/2014 | Yu | ........................ | H04B 10/516 |
| | | | | 398/140 |
| 2017/0063492 A1 | 3/2017 | Horn et al. | | |

FOREIGN PATENT DOCUMENTS

| | | | | |
|---|---|---|---|---|
| CN | 103176014 A | | 6/2013 | |
| CN | 103884890 A | * | 6/2014 | |
| CN | 103884890 A | | 6/2014 | |
| CN | 105866501 A | | 8/2016 | |
| CN | 108226598 A | | 6/2018 | |

* cited by examiner

METHOD AND APPARATUS FOR DECODING OSCILLOSCOPE SIGNAL AND OSCILLOSCOPE

This application is a continuation application of International Application No. PCT/CN2019/070471, filed on Jan. 4, 2019, which claims priority of Chinese Patent Application No. 201810010433.3, filed on Jan. 5, 2018, which is incorporated herein by reference in its entirety.

BACKGROUND

Technical Field

The present application relates to the technical field of oscilloscopes, and in particular, to a method and an apparatus for decoding an oscilloscope signal and an oscilloscope.

Related Art

An oscilloscope is a basic test and measurement device in the electronics industry, and may convert an electrical signal that is invisible to the naked eye into a visible image, which is convenient for people to study the changes in various electrical phenomena. An oscilloscope can be used to observe waveform curves of various signal amplitudes over time, and may further be used to measure different parameters such as a voltage, a current, a frequency, a phase and an amplitude of the electrical signal. The oscilloscope may generally be divided into an analog oscilloscope and a digital oscilloscope.

Currently, as a high-performance oscilloscope, the digital oscilloscope is widely used in development and maintenance of electronic products. The digital oscilloscope usually converts the collected electrical signal into an analog signal, then converts the analog signal into a digital signal, and decodes the digital signal through relying on a hardware device such as a decoder. However, the decoding the digital signal through relying on a hardware device has at least following two problems: poor compatibility, hardware needs to be changed when decoding is performed through a new protocol.

SUMMARY

The present invention is mainly intended to provide a method and an apparatus for decoding an oscilloscope signal and an oscilloscope with good compatibility.

Embodiments of the present invention disclose the following technical solutions.

In a first aspect, an embodiment of the present invention provides a method for decoding an oscilloscope signal, the method including:
  obtaining a voltage signal;
  converting the voltage signal into a digital signal;
  determining whether the digital signal matches a decoding protocol; and
  if so, decoding the digital signal according to the decoding protocol, and outputting decoding result information.

In some embodiments, the converting the voltage signal into a digital signal includes:
  determining high and low level signals in the voltage signal according to a reference voltage;
  determining the digital signal according to the high and low level signals in the voltage signal.

In some embodiments, the determining the digital signal according to the high and low level signals in the voltage signal includes:
  obtaining a baud rate of a measured device;
  obtaining collection frequencies of the high and low level signals; and
  obtaining the digital signal from the high and low level signals of the voltage signal according to the collection frequency and the baud rate.

In some embodiments, the obtaining the digital signal from the high and low level signals of the voltage signal according to the collection frequency and the baud rate includes:
  calculating a ratio of the collection frequency to the baud rate; and
  using, according to the ratio, a signal obtained through extraction from the high and low level signals at an equal interval as the digital signal.

In some embodiments, the determining whether the digital signal matches a decoding protocol includes:
  determining at least one data frame in the digital signal according to a format of a digital frame of the decoding protocol;
  checking each of the at least one data frame;
  determining whether each data frame is checked successfully; and
  if so, determining that the digital signal matches the decoding protocol.

In some embodiments, the protocol includes any of a CAN protocol, an SPI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol.

In some embodiments, if the protocol is the CAN protocol, the determining whether the digital signal matches a decoding protocol further includes:
  if a plurality of consecutive bit values in the digital signal are the same, performing bit value inversion processing on the digital signal;
  the determining at least one data frame in the digital signal according to a format of a digital frame of the decoding protocol includes:
  determining at least one data frame in the processed digital signal according to the format of the digital frame of the decoding protocol.

In some embodiments, the outputting the decoding result information includes:
  displaying the decoding result information.

In some embodiments, the method further includes:
  displaying the voltage signal;
  receiving a viewing operation on the voltage signal by a user;
  the displaying the decoding result information includes:
  displaying the decoding result information corresponding to the viewing operation.

According to a second aspect, an embodiment of the present invention provides an apparatus for decoding an oscilloscope signal, the apparatus including:
  a voltage signal obtaining module configured to obtain a voltage signal;
  a conversion module configured to convert the voltage signal into a digital signal;
  a first determining module configured to determine whether the digital signal matches a decoding protocol; and a decoding result information output module configured to decode the digital signal according to the decoding protocol and output decoding result information when the first determining module determines that the digital signal matches the decoding protocol.

In some embodiments, the conversion module includes:
a high and low level signal determining module configured to determine high and low level signals in the voltage signal according to a reference voltage; and
a digital signal determining module configured to determine the digital signal according to the high and low level signals in the voltage signal.

In some embodiments, the digital signal determining module includes:
a baud rate obtaining unit configured to obtain a baud rate of a measured device;
a collection frequency obtaining unit configured to obtain collection frequencies of the high and low level signals; and
a digital signal determining unit configured to obtain the digital signal from the high and low level signals of the voltage signal according to the collection frequency and the baud rate.

In some embodiments, the digital signal determining unit is specifically configured to:
calculate a ratio of the collection frequency to the baud rate; and
using, according to the ratio, a signal obtained through extraction from the high and low level signals at an equal interval as the digital signal.

In some embodiments, the first determining module is specifically configured to:
determine at least one data frame in the digital signal according to a format of a digital frame of the decoding protocol;
check each of the at least one data frame;
determine whether each data frame is checked successfully; and
if so, determine that the digital signal matches the decoding protocol.

In some embodiments, the protocol includes any of a CAN protocol, an SPI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol.

In some embodiments, the first determining module includes:
a second determining module configured to determine whether the protocol is the CAN protocol;
a third determining module configured to determine whether there are a plurality of consecutive bit values that are the same in the digital signal when the second determining module determines that the protocol is the CAN protocol; and
an inversion processing module configured to perform bit value inversion processing on the digital signal when the third determining module determines that the plurality of consecutive bit values in the digital signal are the same;
the determining, by the first determining module, at least one data frame in the digital signal according to a format of a digital frame of the decoding protocol includes:
determining at least one data frame in the processed digital signal according to the format of the digital frame of the decoding protocol.

In some embodiments, the decoding result information output module is specifically configured to:
display the decoding result information.

In some embodiments, the apparatus further includes:
a voltage signal display module configured to display the voltage signal; and
a viewing operation receiving module configured to receive a viewing operation on the voltage signal by a user;
the displaying, by the decoding result information output module, the decoding result information includes:
displaying the decoding result information corresponding to the viewing operation.

According to a third aspect, an embodiment of the present invention provides an oscilloscope, including:
at least one processor; and
a memory communicably connected to the at least one processor, where
the memory stores instructions that may be executed by the at least one processor, the instructions being executed by the at least one processor, so that the at least one processor can perform the foregoing method for decoding the oscilloscope signal.

According to a fourth aspect, an embodiment of the present invention provides a computer program product that includes a computer program stored in a non-volatile computer readable storage medium, the computer program including a program instruction that, when executed by an oscilloscope, causes the oscilloscope to perform the foregoing method for decoding an oscilloscope signal.

According to a fifth aspect, an embodiment of the present invention provides a non-volatile computer readable storage medium that stores a computer executable instruction that is used to cause an oscilloscope to perform the foregoing method for decoding an oscilloscope signal.

In the embodiments of the present invention, the digital signal is decoded according to the decoding protocol, to generate the decoding result information without relying on a hardware device for decoding, so that when a new protocol is used for decoding, decoding compatibility may be improved without changes in hardware.

DETAILED DESCRIPTION

The technical solutions in the embodiments of the present application will be described clearly and completely below with reference to the drawings in the embodiments of the present application. Obviously, the described embodiments are part of the embodiments of the present application, but not all of the embodiments. Based on the embodiments in the present application, all other embodiments obtained by a person of ordinary skill in the art without creative efforts shall fall within the protection scope of the present application.

In addition, the technical features involved in the various embodiments of the present invention described below can be combined with each other as long as they do not conflict with each other.

Embodiment 1

Embodiments of the present invention provide a method and an apparatus for decoding an oscilloscope signal and an oscilloscope. The method and apparatus for decoding the oscilloscope signal and the oscilloscope may decode a digital signal without relying on a hardware device, reduce costs of the oscilloscope and achieve good decoding compatibility. The following illustrates an application environment of the foregoing method.

Figure 1:
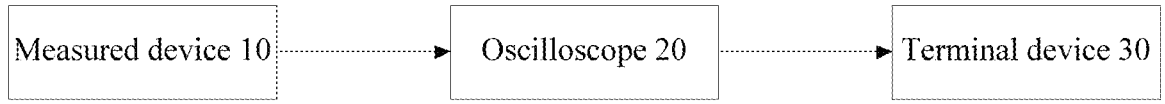
FIG. 1 is a schematic diagram of an application environment of a method for decoding an oscilloscope signal according to an embodiment of the present invention.

Referring to FIG. 1, FIG. 1 is a schematic diagram of an application environment of a method for decoding an oscilloscope signal according to an embodiment of the present invention. The application scenario includes: a measured device 10, an oscilloscope 20 and a terminal device 30. During use, the oscilloscope 20 is connected to the measured device 10 and the terminal device 30, respectively. First, the oscilloscope 20 interacts with the measured device 10 to obtain a voltage signal; then, the voltage signal is converted into a digital signal and the digital signal is decoded; and finally, decoding result information obtained through decoding the digital signal is sent to the terminal device 30. The measured device may include an electronic control unit in a vehicle.

In another application scenario, the oscilloscope may be used as a module or unit and integrated in the terminal device 30.

In still another application scenario, the terminal device 30 may have an oscilloscope function and may directly communicate with the measured device 10.

Alternatively, in still another application scenario, the oscilloscope may be provided with a display apparatus such as a display screen, and the oscilloscope may display a signal.

Figure 2:
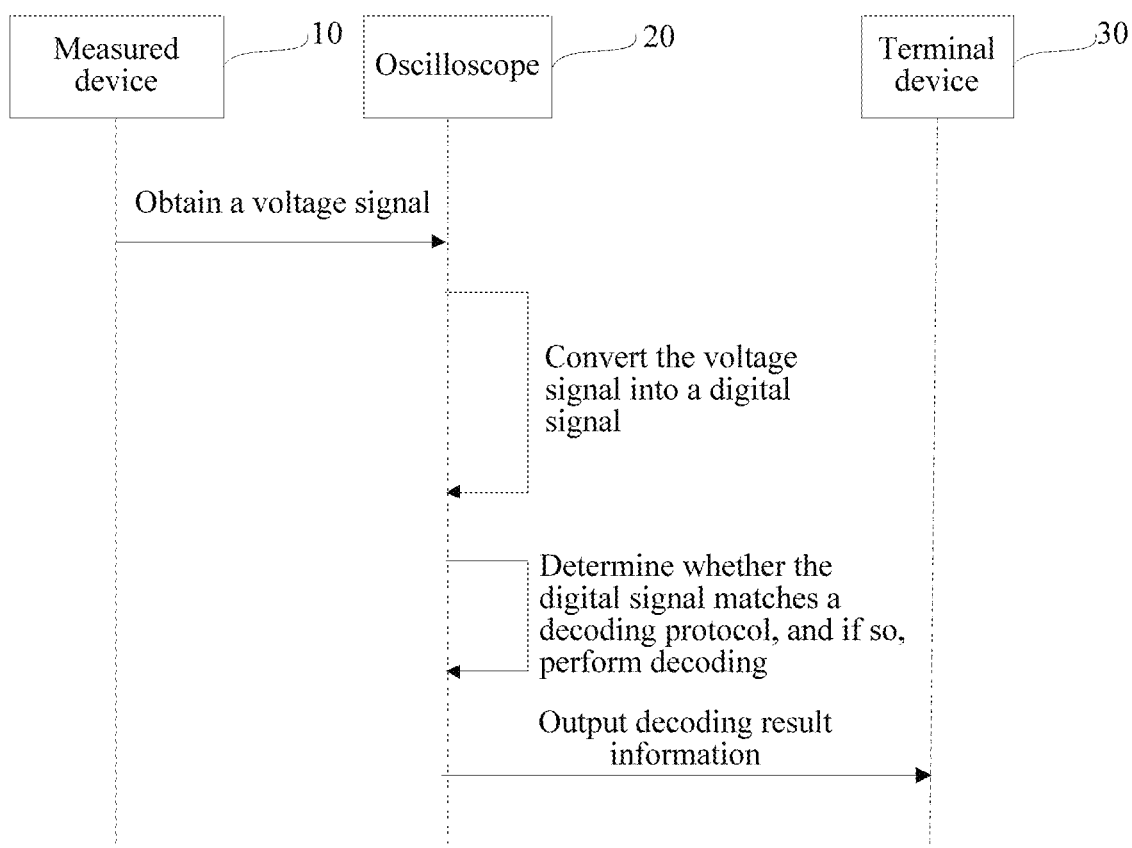
FIG. 2 is a schematic diagram of a specific implementation principle for decoding an oscilloscope signal according to an embodiment of the present invention.

Referring to FIG. 2, FIG. 2 is a schematic diagram of a specific implementation principle for decoding an oscilloscope signal based on the application environment shown in FIG. 1 according to an embodiment of the present invention. Definitely, for other application environments, the terminal device may implement the following method performed by the oscilloscope, or the oscilloscope may implement the following method performed by the terminal device, which is not limited herein. The method includes the following.

1. The oscilloscope 20 interacts with the measured device 10, and obtains a voltage signal through collection. Specifically, the oscilloscope 20 may perform data collection at a preset sampling frequency to obtain the voltage signal. The voltage signal is an analog signal, and the voltage signal is a voltage that changes with time. The voltage signal may be displayed on the oscilloscope 20 and may be represented as a waveform.

2. The oscilloscope 20 processes the voltage signal, that is, converts the voltage signal into a digital signal. The converting the voltage signal into a digital signal specifically includes:

first determining, by the oscilloscope 20, high and low level signals in the voltage signal according to a reference voltage. Specifically, the oscilloscope 20 obtains a reference voltage and determines the high and low level signals in the voltage signal according to the reference voltage, the high and low level signals including a high level signal and a low level signal. The reference voltage input by a user may be received through the terminal device 30 and then sent to the oscilloscope 20, so that the reference voltage is obtained. For example, the terminal device 30 provides an interface for inputting a reference voltage to receive a reference voltage input by a user. For example, if the reference voltage is 0 V, the terminal device 30 transmits the reference voltage to the oscilloscope 20, and the oscilloscope 20 compares the reference voltage (0 V) with all data in the voltage signal, where a point less than 0 V in all the data is considered as a low level signal, and a point greater than 0 V is considered as a high level signal. A value of the high level signal is represented by a number "1", and a value of the low level signal is represented by a number "0".

Then, the oscilloscope 20 determines a digital signal according to the high and low level signals of the voltage signal. Because an amount of data generated by the measured device 10 per second and an amount of data collected by the oscilloscope 20 per second may be inconsistent or even differ considerably, when the two are inconsistent or differ considerably, a large amount of invalid duplicate data may exist in data collected by the oscilloscope 20. Therefore, it is necessary to eliminate the invalid data and obtain valid data to determine the digital signal. The determining a digital signal according to high and low level signals of the voltage signal may include: obtaining a baud rate of a measured device; obtaining collection frequencies of the high and low level signals; and obtaining the digital signal from the high and low level signals of the voltage signal according to the collection frequency and the baud rate. The baud rate of the measured device 10 refers to the amount of data generated by the measured device 10 per second. Since the high and low level signals are determined based on the reference voltage, the high and low level signals have a same frequency as the voltage signal, that is, a sampling frequency at which the oscilloscope 20 performs sampling. Specifically, the collection frequency of the high and low level signals is equal to the amount of data collected by the oscilloscope per second. The oscilloscope 20 may obtain the baud rate of the measured device based on an operation of setting the baud rate of the measured device by the user. Similarly, the oscilloscope 20 may alternatively obtain, based on an operation of setting the sampling frequency of the oscilloscope by the user, the sampling frequency at which the oscilloscope 20 collects data, that is, the collection frequency of the high and low level signals. The obtaining the digital signal from the high and low level signals of the voltage signal according to the collection frequency and the baud rate may specifically include: calculating a ratio of the collection frequency to the baud rate; using, according to the ratio, a signal obtained through extraction from the high and low level signals at an equal interval as the digital signal. For example, the baud rate of the measured device 10 is 100 Baud (Baud is a unit of the baud rate). The sampling frequency of the oscilloscope 20 is 1000 Hz (frequency), that is, the measured device 10 generates 100 pieces of data per second, and the oscilloscope 20 collects 1000 pieces of data per second. According to the collection frequency and the baud rate, a ratio of the two that is obtained through calculation is 10:1, and according to the ratio, a signal obtained through extracting one piece of data from every 10 pieces of data from all the high and low level signals is used as the digital signal. For example, if the amount of data of all the high and low level signals is 2000, and 1 piece of data is extracted from every 10 pieces of data, the amount of data of the obtained signal is 200, and the signal is used as the digital signal. The digital signal is determined through the collection frequency and the baud rate, and the sampling frequency of the oscilloscope 20 may be set for different measured devices, so that the sampling frequency of the oscilloscope 20 is close to the baud rate of the measured device 10 to eliminate a large number of invalid data, improve obtaining of valid data and improve efficiency of data processing. The digital signal may be binary data, such as "110101110000" and the like.

Figure 3:
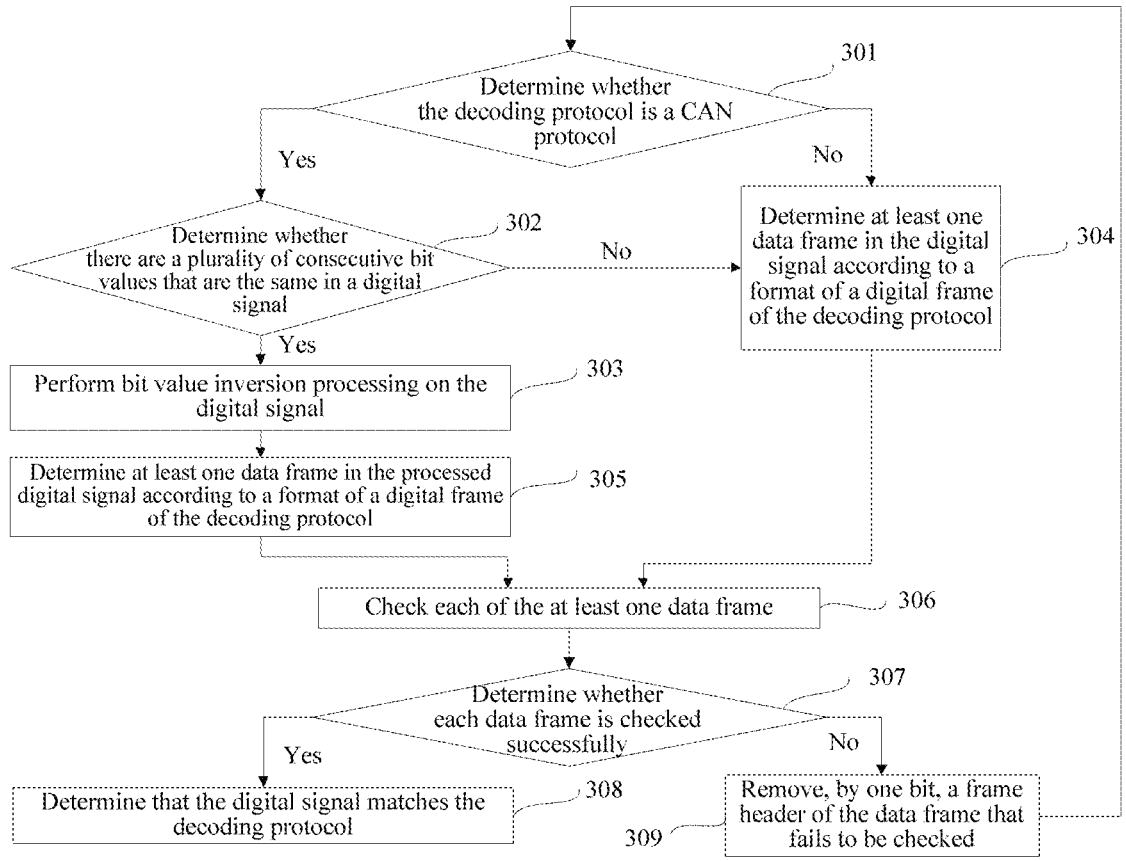
FIG. 3 is a schematic flowchart of data format matching according to an embodiment of the present invention.

3. The oscilloscope 20 determines whether the digital signal matches a decoding protocol. The decoding protocol may be any suitable protocol, for example, a controller area network (CAN) protocol, a serial peripheral interface (SPI) protocol, and the like. FIG. 3 is a specific schematic flowchart of determining whether the digital signal matches a decoding protocol according to an embodiment of the present invention. The determining whether the digital signal matches a decoding protocol may include the following steps.

301: It is determined whether the decoding protocol is a CAN protocol.

The decoding protocol includes: the CAN protocol, an SPI protocol, an SD_SPI protocol, a universal asynchronous receiver/transmitter (UART) protocol, an I2S (Inter-IC Sound) protocol, an I2C (Inter-Integrated Circuit) protocol, a 1-Wire protocol, a local interconnect network (LIN) protocol, a FlexRay (FlexRay Consortium) protocol, an ARINC429 protocol, a universal serial bus (USB) protocol, a DMX512 protocol and a digital command control (DCC) protocol. The oscilloscope 20 determines whether the decoding protocol is the CAN protocol and the like.

302: If the decoding protocol is the CAN protocol, it is determined whether there are a plurality of consecutive bit values that are the same in a digital signal.

A bit is a unit of amount of information, usually in binary. For example, "010010001" is a piece of information, a number representing a bit. For example, "01" represents two bits, and "01001" represents five bits. A bit value is a specific represented value such as "0" or "1". In the embodiment of the present invention, the determining whether there are a plurality of consecutive bit values that are the same in the digital signal specifically includes: determining whether there are six or more consecutive bit values that are the same in the digital signal.

303: If a plurality of consecutive bit values in the digital signal are the same, bit value inversion processing is performed on the digital signal.

Specifically, when it is determined that there are six or more consecutive bit values that are the same in the digital signal, inversion processing is performed on a bit value that appears for the sixth time among the consecutive same bit values that appear.

When it is determined that the decoding protocol is the CAN protocol, the inversion processing is performed. For example, if the decoding protocol is the CAN protocol and it is determined that the six consecutive bit values in the digital signal are the same, if "111111" appears, inversion processing is performed on the bit value appearing for the sixth time. After the inversion processing, the data of this segment becomes "111110".

304: If the decoding protocol is not the CAN protocol or there are no a plurality of consecutive bit values that are the same in the digital signal, inversion processing is not required, and at least one data frame in the digital signal is determined directly according to a format of a digital frame of the decoding protocol.

305: If the decoding protocol is the CAN protocol or there are a plurality of consecutive bit values that are the same in the digital signal, at least one data frame in the processed digital signal is determined according to a format of a digital frame of the decoding protocol.

Specifically, the at least one data frame in the digital signal on which the inversion processing is performed is determined according to the format of the digital frame of the decoding protocol.

306: Each of the at least one data frame is checked.

Each of the at least one data frame may be checked in any suitable manner. For example, a CRC is performed by using a cyclic redundancy check (CRC) code to check the at least one data frame in the digital signal on which the inversion processing is performed. It should be noted that the CRC is the prior art, and therefore details are not described herein again.

307: It is determined whether each data frame is checked successfully.

308: If so, it is determined that the digital signal matches the decoding protocol.

309: If not, a frame header of a data frame that fails to be checked is moved by one bit, and the step of determining whether the decoding protocol is a CAN protocol is performed.

The frame header of a data frame that fails to be checked is moved by one bit to reconfirm the frame header of the data frame. The frame header may be moved forward by one bit or backward by one bit. In step 301, it is determined whether the decoding protocol is a CAN protocol until the check is successful, so that the next frame data of the data frame in the digital signal may be processed.

It should be noted that, in some other embodiments, if there is no contradiction, the steps 301-309 have different execution orders.

4. If the digital signal matches the decoding protocol, the oscilloscope 20 decodes the digital signal according to the decoding protocol and outputs decoding result information. The decoding protocol may be a CAN protocol. The format of the decoding protocol includes, but is not limited to: a CAN standard frame format, a CAN extended frame format, or the like. The decoding result information may be composed of binary data, octal data or hexadecimal data. In the embodiment of the present invention, the outputting decoding result information includes: sending, by the oscilloscope 20, the decoding result information to the terminal device 30.

5. The terminal device 30 receives the decoding result information and displays the decoding result information. For example, the decoding result information is displayed on a user interface of the terminal device 30. Since each piece of the decoding result information has a corresponding time and amplitude, and the voltage signal is a time-domain signal, that is, the voltage changes with time, a decoding result related to the voltage signal may be displayed on the user interface of the terminal device 30. Specifically, first, the voltage signal is displayed on the user interface of the terminal device 30, and then a viewing operation on the voltage signal by a user is received. When the viewing operation is viewing decoding result information, the decoding result information corresponding to the viewing operation may be displayed on the user interface of the terminal device 30, that is, the decoding result information is a mark performed on a waveform corresponding to the voltage signal.

In some embodiments, the terminal device 30 may receive an image scaling instruction to scale a display image that is of a voltage signal and that is displayed on the user interface of the terminal device 30 and/or a display image of decoding result information. For example, the terminal device 30 provides a frame selection tool, and the frame selection tool may be used to scale and display the image during the corresponding time period selected by the frame. When the image during the time period is displayed relatively intensively, the image scaling instruction may be used to magnify the image during the time period for easy observation. When the image during the time period is displayed relatively loosely, the image scaling instruction may be used to reduce the image during the time period to adjust the image within a display range suitable for a user to observe. The terminal device 30 may receive an image dragging instruction to drag a display image of the voltage signal and/or a display image of decoding result information, which is convenient for users to observe images in different time periods as required.

It should be noted that, in the embodiment of the present invention, the measured device 10 may be various types of electronic components, for example, electronic components of an automobile. The terminal device 30 may be a personal computer (PC), a tablet, a smart phone, or the like.

It should further be noted that in some other embodiments, functions of the oscilloscope 20 and the terminal device 30 may be integrated into a same device, that is, the device may implement all the functions of the oscilloscope 20 and the terminal device 30. For example, all the functions of the oscilloscope 20 and the terminal device 30 are integrated on an oscilloscope.

In the embodiment of the present invention, the oscilloscope 20 decodes the digital signal according to the decoding protocol to generate decoding result information without relying on a hardware device for decoding, thereby improving decoding compatibility without changes in the hardware when a new protocol is used for decoding. In addition, the user does not need to know the protocol in detail to reduce the threshold for use of decoding.

Embodiment 2

Figure 4:
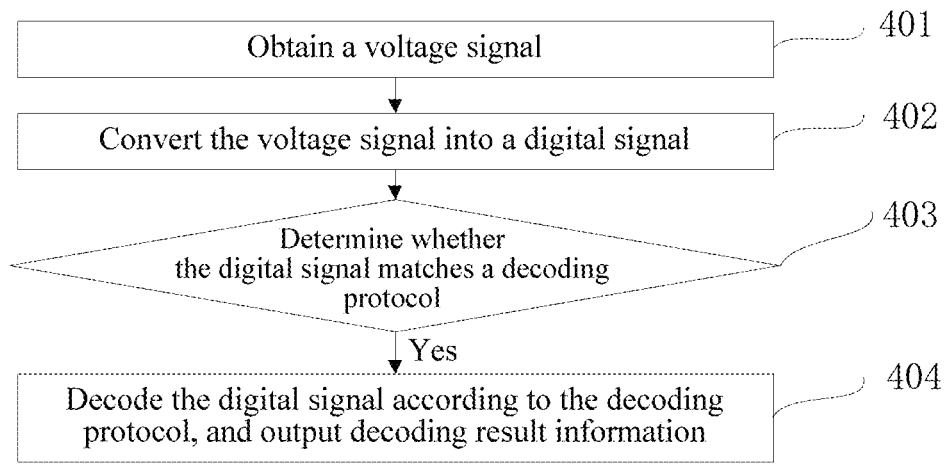
FIG. 4 is a schematic flowchart of a method for decoding an oscilloscope signal according to an embodiment of the present invention.

FIG. 4 is a schematic flowchart of a method for decoding an oscilloscope signal according to an embodiment of the present invention. The method for decoding an oscilloscope signal according to an embodiment of the present invention is applied to an oscilloscope, and may be performed by the oscilloscope 20 in FIG. 1.

Referring to FIG. 4, the method includes the following steps.

401: A voltage signal is obtained.

The oscilloscope is connected to a measured device to obtain the voltage signal. The voltage signal is an analog signal, and the voltage signal is a voltage that changes with time and may be represented as a waveform.

402: The voltage signal is converted into a digital signal.

403: It is determined whether the digital signal matches a decoding protocol.

The decoding protocol may be any suitable protocol, for example, a CAN protocol, an SPI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol. The determining whether the digital signal matches a decoding protocol may include: performing data format matching on the digital signal according to a decoding protocol to determine whether the digital signal matches a decoding protocol. The matching means that the digital signal completely matches the format of the decoding protocol.

404. If the digital signal matches the decoding protocol, the digital signal is decoded according to the decoding protocol, and decoding result information is output.

When it is determined that the digital signal matches the decoding protocol, the oscilloscope may decode the digital signal according to the decoding protocol to generate decoding result information and output the decoding result information. The decoding result information may be composed of binary data, octal data or hexadecimal data.

The outputting, by the oscilloscope, the decoding result information may include: directly displaying the decoding result information on the oscilloscope; or sending the decoding result information to an external terminal device for display on the terminal device.

It should be noted that, for technical details not described in detail in steps 401-404 in the embodiments of the present invention, reference may be made to the specific description of the foregoing embodiments.

In the embodiment of the present invention, the digital signal is decoded according to the decoding protocol to generate decoding result information without relying on a hardware device for decoding, thereby improving decoding compatibility without changes in the hardware when a new protocol is used for decoding. In addition, the user does not need to know the protocol in detail to reduce the threshold for use of decoding.

Embodiment 3

Figure 5:
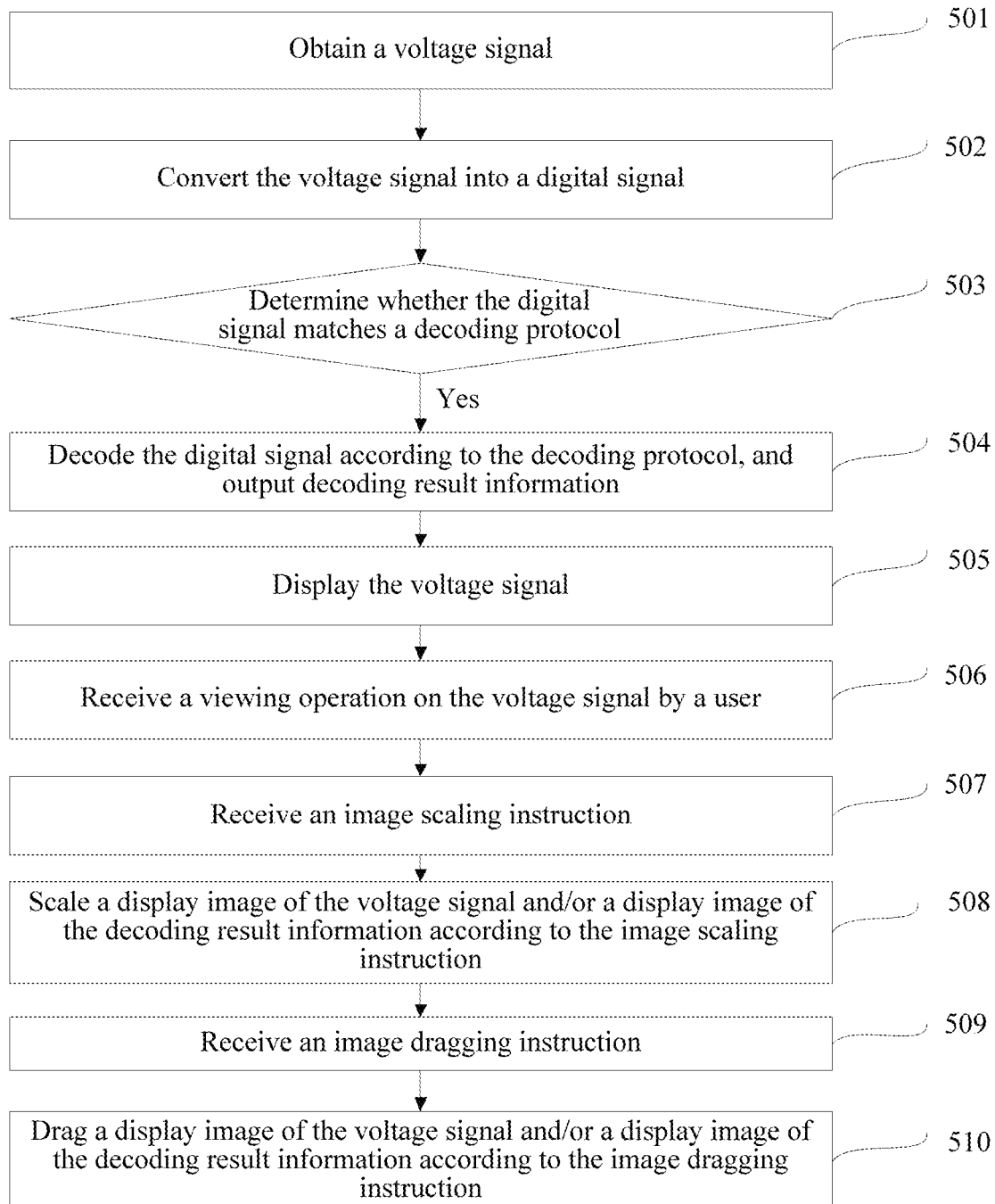
FIG. 5 is a schematic flowchart of a method for decoding an oscilloscope signal according to another embodiment of the present invention.

FIG. 5 is a schematic flowchart of a method for decoding an oscilloscope signal according to another embodiment of the present invention. The method for decoding an oscilloscope signal according to another embodiment of the present invention is applied to an oscilloscope, and may be performed by the oscilloscope 20 in FIG. 1.

Referring to FIG. 5, the method includes the following steps.

501: A voltage signal is obtained.

The oscilloscope is connected to a measured device to obtain the voltage signal. The voltage signal is an analog signal, and the voltage signal is a voltage that changes with time and may be represented as a waveform.

502: The voltage signal is converted into a digital signal.

The converting the voltage signal into a digital signal specifically includes: determining high and low level signals in the voltage signal according to a reference voltage; and determining a digital signal according to the high and low level signals in the voltage signal. The reference voltage may be a user-defined voltage value. For example, a user input operation is received to obtain a reference voltage. In some embodiments, the reference voltage may further be a voltage value predefined by a system. The reference voltage is compared with all the data in the voltage signal to determine the high and low level signals in the voltage signal. For example, the reference voltage is O V, and the reference voltage is compared with all voltage values in the voltage signal. A voltage value less than O V is set as a low level signal, and a voltage value greater than O V is set as a high level signal. A value of the high level signal is represented by a number "1", and a value of the low level signal is represented by a number "0". The high and low level signals in the voltage signal are determined through the reference voltage, and amplitude values of each data point of the voltage signal may be converted into high and low levels, that is, "0" or "1".

Because the amount of data generated by the measured device per second and the amount of data collected by the oscilloscope per second may be inconsistent or differ considerably, when the two are inconsistent or differ considerably, there is a large amount of invalid duplicated data in data collected by the oscilloscope. Therefore, it is necessary to eliminate invalid data and obtain valid data, that is, necessary to obtain digital signals from high and low level signals of the voltage signal. The determining a digital signal according to high and low level signals of the voltage signal specifically includes: obtaining a baud rate of a measured device; obtaining collection frequencies of the high and low level signals; and obtaining the digital signal from the high and low level signals of the voltage signal according to the collection frequency and the baud rate. Specifically, the obtaining the digital signal from the high and low level signals of the voltage signal according to the collection frequency and the baud rate includes: calculating a ratio of the collection frequency to the baud rate; using, according to the ratio, a signal obtained through extraction from the high and low level signals at an equal interval as the digital signal.

For example, the baud rate of the measured device is 100 Baud, that is, the measured device generates 100 pieces of data per second; the sampling frequency of the oscilloscope is 1000 Hz, that is, the oscilloscope collects 1000 pieces of data per second, that is, the collection frequency of the high and low level signals is 1000 Hz. According to the collection frequency and the baud rate, a ratio of the two that is obtained through calculation is 10:1, and according to the ratio, a signal obtained through extracting one piece of data from every 10 pieces of data from all the high and low level signals is used as the digital signal. For example, if the amount of data of all the high and low level signals is 2000, and 1 piece of data is extracted from every 10 pieces of data, the amount of data of the obtained signal is 200, and the signal is used as the digital signal. The digital signal may be binary data, such as "110101110000" and the like. The digital signal is determined through the collection frequency and the baud rate, and the sampling frequency of the oscilloscope may be set for different measured devices, so that the sampling frequency of the oscilloscope is close to the baud rate of the measured device to eliminate a large number of invalid data, improve obtaining of valid data and improve efficiency of data processing.

503: It is determined whether the digital signal matches a decoding protocol.

The decoding protocol includes, but is not limited to: a CAN protocol, an SPI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol.

Specifically, the determining whether the digital signal matches a decoding protocol specifically includes: determining at least one data frame in the digital signal according to a format of a digital frame of the decoding protocol; checking each of the at least one data frame; determining whether each data frame is checked successfully; and if so, determining that the digital signal matches the decoding protocol.

If the decoding protocol is the CAN protocol, the determining whether the digital signal matches a decoding protocol further includes:

if a plurality of consecutive bit values in the digital signal are the same, performing bit value inversion processing on the digital signal.

On a basis that if the plurality of consecutive bit values in the digital signal are the same, bit value inversion processing is performed on the digital signal. The determining at least one data frame in the digital signal according to a format of a digital frame of the decoding protocol includes: determining at least one data frame in the processed digital signal according to a format of a digital frame of the decoding protocol.

When the decoding protocol is a CAN protocol, the format of the decoding protocol may include, but is not limited to: a CAN standard frame format or a CAN extended frame format. The following uses the CAN standard frame format as an example to give a detailed description of a specific process of determining whether the digital signal matches a decoding protocol.

Figure 6:
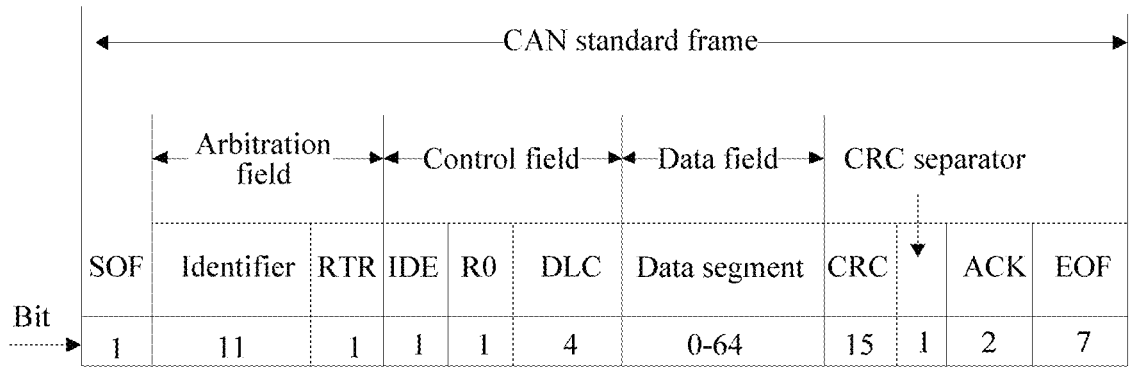
FIG. 6 is a schematic diagram of a CAN standard frame format according to an embodiment of the present invention.

As shown in FIG. 6, FIG. 6 is a schematic diagram of a CAN standard frame format according to an embodiment of the present invention. The CAN standard frame includes the following bit fields: start of frame, an arbitration field, a control field, a data field, a CRC field, an acknowledgement field and end of frame.

Start of Frame (SOF): indicates the start of a data frame and a remote frame, which consists of only one dominant bit. Transmission is allowed only when a bus is in an idle state. All stations must be synchronized to the start of the frame of the station that starts transmission first. The dominant bit is "0", and a recessive bit is "1".

Arbitration field: In a standard format, the arbitration field is composed of an 11-bit identifier and a remote transmission request (RTR) bit. In an extended format, the arbitration field is composed of a 29-bit identifier and a substitute remote request (SRR) bit, an identifier extension (IDE) bit, an extension identifier and an RTR bit. In a data frame, the RTR bit must be at the "dominant" level, and in a remote frame, the RTR bit must be at the "recessive" level. The SRR bit is always a "recessive" bit in the extended format. The IDE bit belongs to the control field for the standard format, and belongs to the arbitration field for the extended format. The IDE is at the "dominant" level in the standard format and is at the "recessive" level in the extended format.

Control field: consists of 6 bits. In the standard format, one information frame includes a data length code (DLC), a DIE bit for transmitting a dominant level and a reserved bit R0. In the extended format, one information frame includes the DLC and two reserved bits R1 and R0, and the two bits must transmit a dominant level. The number of bytes in the data field is given by the DLC. The DLC has 4 bits and is sent in the control field.

Data field: consists of the data sent in the data frame and may include 0 to 8 bytes, 1 byte being equal to 8 bits.

CRC field: includes a CRC sequence and a CRC separator.

Acknowledgement (ACK) field: includes two bits, that is, an acknowledgement bit and an acknowledgement delimiter. A transmission station sends two recessive bits in the acknowledgement field. A receiver that receives a valid message correctly reports the information to a transmitter by transmitting a dominant bit during the acknowledgement gap. All stations that receive a matching CRC sequence report by writing the "dominant" bit to the recessive bit of the transmitter within the acknowledgement gap. The acknowledgement delimiter is the second bit of the acknowledgement field and must be a recessive bit.

End of Frame (EOF): Each data frame and remote frame are both defined by a flag sequence composed of 7 recessive bits.

Figure 7:
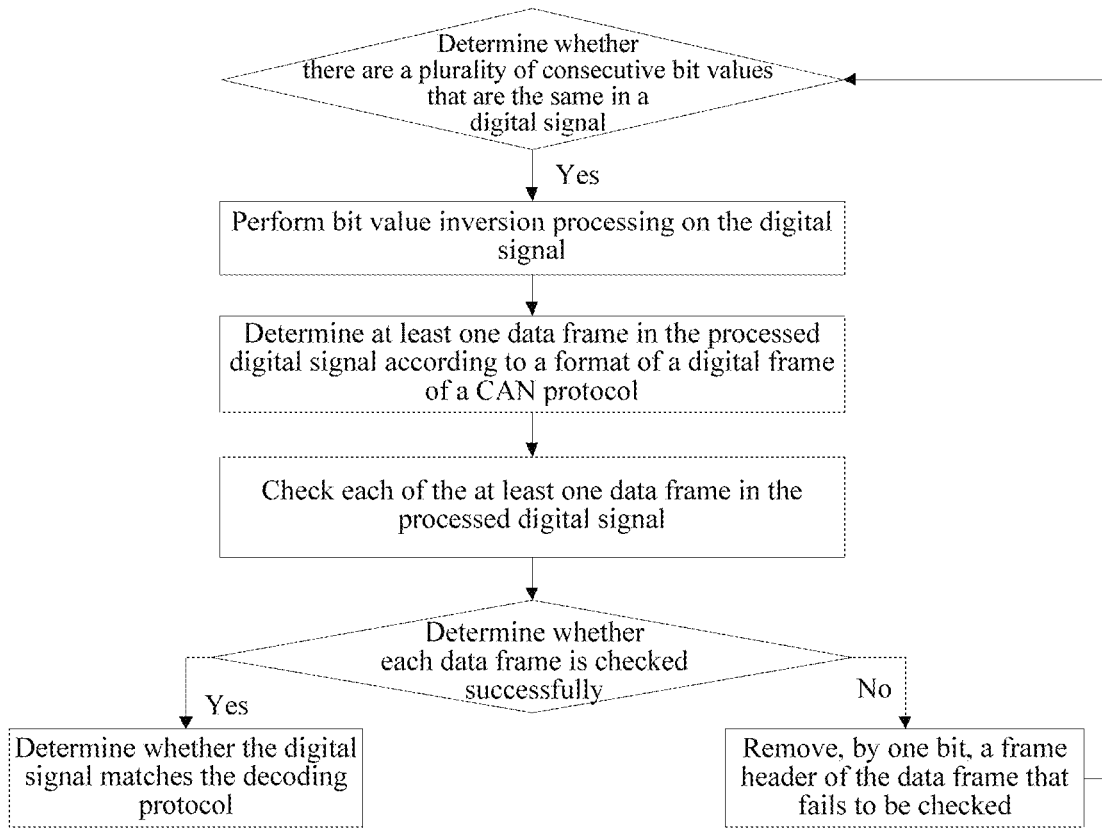
FIG. 7 is a schematic flowchart of performing matching according to a CAN standard frame format according to an embodiment of the present invention.

According to the foregoing CAN standard frame format, it is determined whether the digital signal matches a decoding protocol. As shown in FIG. 7, FIG. 7 is a schematic flowchart of determining, according to a CAN standard frame format, whether the digital signal matches a decoding protocol according to an embodiment of the present invention. The determining whether the digital signal matches a decoding protocol may include the following steps.

First, it is determined whether there are a plurality of consecutive bit values that are the same in the digital signal. The determining whether there are a plurality of consecutive bit values that are the same in the digital signal specifically includes: determining whether there are six or more consecutive bit values that are the same in the digital signal.

Next, when it is determined that there are a plurality of consecutive bit values that are the same, bit value inversion processing is performed on the digital signal. For example, when there are six or more consecutive bit values that are the same in the digital signal, inversion processing is performed on a bit value that appears for the sixth time among the consecutive same bit values that appear. For example, when it is determined that the six consecutive bit values in the digital signal are the same, such as "000000", inversion processing is performed on the bit value appearing for the sixth time. After the inversion processing, the data of this segment becomes "000001".

Again, according to the format of the digital frame of the CAN protocol, at least one data frame in the processed digital signal is determined.

Figure 8:
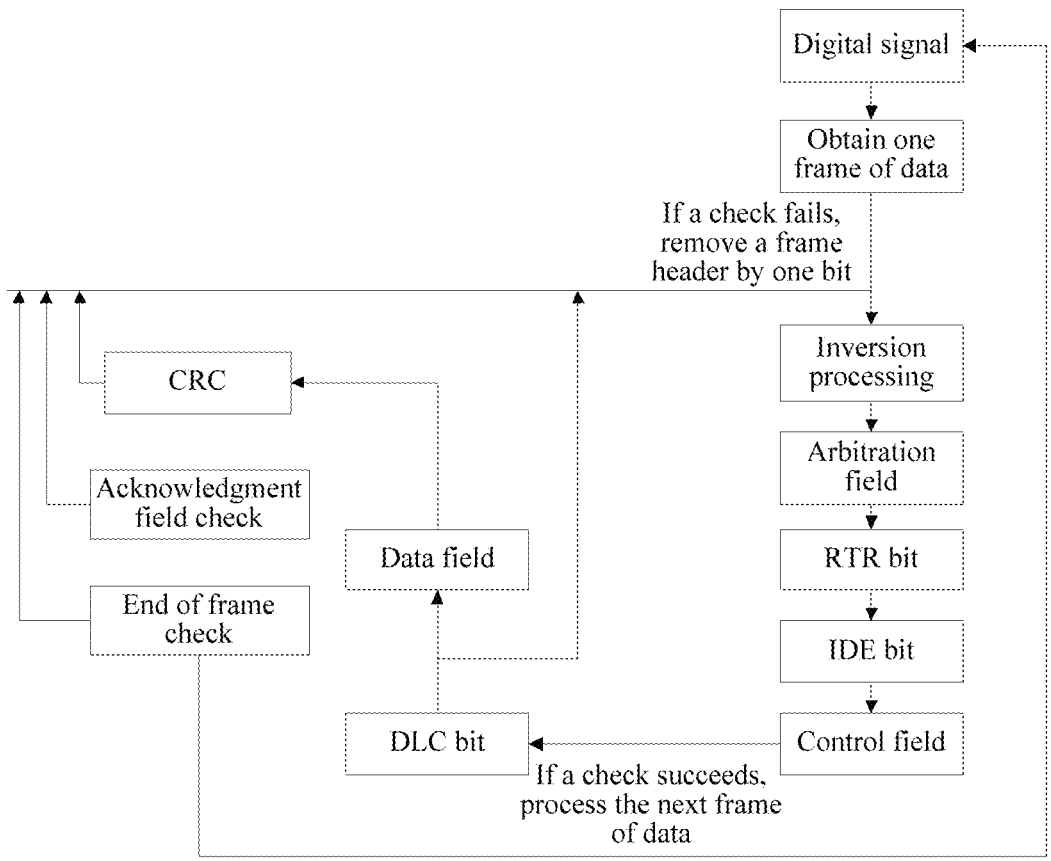
FIG. 8 is a schematic diagram of checking a data frame according to an embodiment of the present invention.

Then each of the at least one data frame in the processed digital signal is checked. Specifically, as shown in FIG. 8, the checking each of the at least one data frame in the processed digital signal includes: obtaining DLC data in one data frame, and determining whether the DLC data is correct; obtaining a CRC field in a data frame and performing a CRC; obtaining an acknowledgement field in a data frame and performing an acknowledgement field check; and obtaining an end frame in a data frame and performing an end frame check. Specifically, data of start of frame, an arbitration field, a control field, a data field, a CRC field, an acknowledgement field, and an end of frame of one of the at least one data frame on which the inversion processing is performed are sequentially obtained in bits. The arbitration field includes an identifier and an RTR bit, and the control field includes an IDE, an R0 bit and a DLC. The DLC data is used to determine the occupancy of the data field in a frame of data. Since the data field is determined by the DLC, the frame data may be checked by determining whether the DLC data is correct. After the DLC data is determined to be correct, a CRC is performed. The CRC is a commonly used data check method, and the CRC is a prior art, and details are not described herein again. After the CRC, the acknowledgement field check is performed, and the end frame check is finally performed.

Finally, it is determined whether each data frame is checked successfully. If the check is successful, it is determined that the digital signal matches the decoding protocol. If the check fails, a frame header of the data frame that fails to be checked is moved by one bit, and the step of determining whether there are a plurality of consecutive bit values that are the same in the digital signal is performed.

It should be noted that in the foregoing check, if the DLC data is incorrect or any other check fails, it is necessary to return to the step of determining whether there are a plurality of consecutive bit values that are the same in the digital signal, and process a piece of frame data with a reconfirmed frame header until the check succeeds, so that a next frame of data of the data frame in the digital signal may be processed in the same manner.

It should be noted that, if the decoding protocol is not the CAN protocol, the inversion processing is not required, and each of the at least one data frame is directly checked. If the check is unsuccessful, the frame header of the data frame that fails to be checked is moved by one bit, and the frame of data continues to be checked.

504: If the digital signal matches the decoding protocol, the digital signal is decoded according to the decoding protocol, and decoding result information is output.

When it is determined that the digital signal matches the decoding protocol, the oscilloscope may decode the digital signal according to the decoding protocol to generate decoding result information. The matching means that the digital signal completely matches the format of the decoding protocol. The decoding result information may be composed of binary data, octal data or hexadecimal data.

The outputting the decoding result information includes: displaying the decoding result information.

505: The voltage signal is displayed.

Specifically, a display image of the voltage signal may be displayed.

506: A viewing operation on the voltage signal by a user is received.

Since each piece of the decoding result information has a corresponding time and amplitude, and the voltage signal is a time-domain signal, that is, the voltage changes with time, decoding result information related to the voltage signal may be displayed on the oscilloscope. That is, based on step 505 and step 506, the step 504 of displaying the decoding result information in the outputting the decoding result information may include: displaying the decoding result information corresponding to the viewing operation.

Figure 9A:
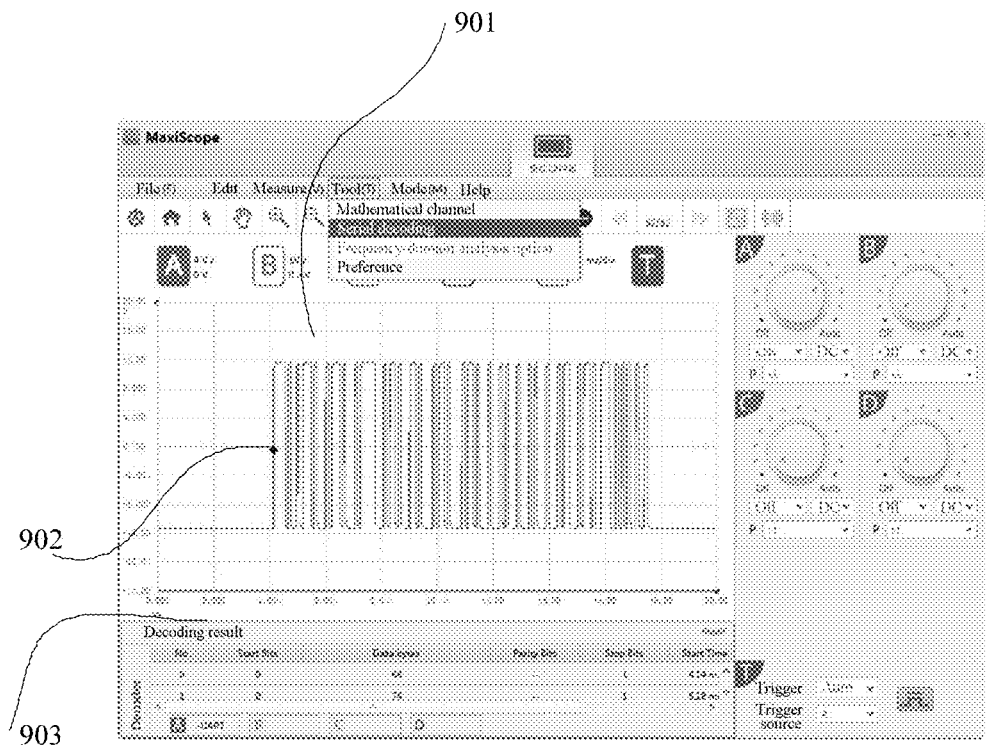
FIG. 9A and FIG. 9B are each a schematic diagram of displaying decoding result information corresponding to a viewing operation according to an embodiment of the present invention.
Figure 9B:
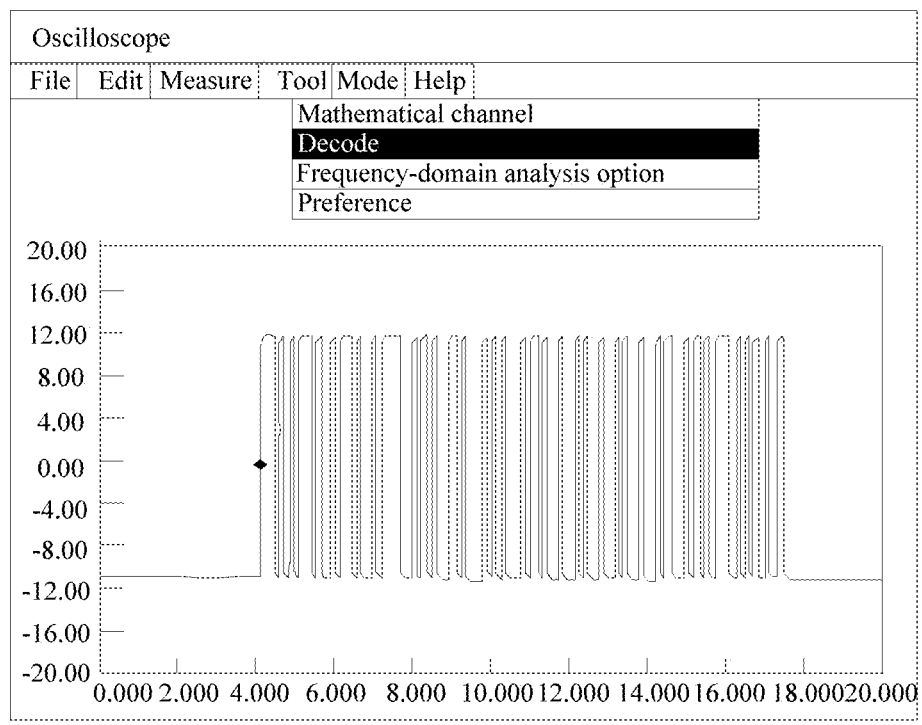

Specifically, as shown in FIG. 9A and FIG. 9B in FIG. 9, the voltage signal is displayed on the oscilloscope (such as a display waveform 901 in FIG. 9A), and then a viewing operation on the voltage signal by a user is received. As shown in FIG. 9A, the viewing operation on the voltage signal by the user is a touch operation 902 on the display waveform 901 by the user, or as shown in FIG. 9B, the viewing operation on the voltage signal by the user is a menu selection operation. When the viewing operation is viewing the decoding result information, the decoding result information corresponding to the viewing operation may be displayed on the oscilloscope, for example, decoding result information 903 shown in FIG. 9A. The displayed decoding result information 903 corresponds to the viewing operation of the user. For example, if the user views decoding result information related to the voltage signal of a certain segment or a certain point only through a touch operation, the decoding result information to be viewed by the user is displayed. Alternatively, when the user selects to view the decoding result information through a menu selection operation, some or all of the decoding result information related to the voltage signal may be viewed.

507: An image scaling instruction is received.

The oscilloscope may receive an image scaling instruction to scale a display image that is of a voltage signal and that is displayed on the oscilloscope and/or a display image of the decoding result information. The image scaling instruction may be generated based on an operation of the user.

508: The display image of the voltage signal and/or a display image of the decoding result information are scaled according to the image scaling instruction.

The oscilloscope may scale, according to the image scaling instruction, the display image that is of the voltage signal and that is displayed on the oscilloscope and/or the display image of the decoding result information. The entire display image of the voltage signal and/or the display image of the decoding result information may be scaled, or a portion of the display image of the voltage signal and/or the display image of the decoding result information may be scaled. For example, the oscilloscope provides a frame selection tool, and the frame selection tool may be used to scale and display the display image during the corresponding time period selected by the frame. When the display image during the time period is displayed relatively intensively, the image scaling instruction may be used to magnify the display image during the time period for easy observation. When the display image during the time period is displayed relatively loosely, the image scaling instruction may be used to reduce the display image during the time period to adjust the display image of the voltage signal and/or the display image of the decoding result information within a display range suitable for a user to observe.

509: An image dragging instruction is received.

The oscilloscope may receive an image dragging instruction to drag the display image that is of the voltage signal and that is displayed on the oscilloscope and/or the display image of the decoding result information. The image dragging instruction may be generated based on an operation of the user.

510: The display image of the voltage signal and/or the display image of the decoding result information are dragged according to the image dragging instruction.

The oscilloscope may drag, according to the image dragging instruction, the display image that is of the voltage signal and that is displayed on the oscilloscope and/or the display image of the decoding result information. The display image of the voltage signal and/or the display image of the decoding result information may be dragged left and right, or the display image of the voltage signal and/or the display image of the decoding result information may be dragged up and down. The display image of the voltage signal and/or the display image of the decoding result information are dragged, which is convenient for users to observe images in different time periods as required.

It may be understood that, in some other embodiments, the steps 507-510 may not be required in different embodiments. In addition, those skilled in the art may understand, according to the description of the embodiments of the present invention, that in different embodiments, if there is no contradiction, the steps 501-510 may have different execution orders.

It should be noted that, for technical details not described in detail in steps 501-510 in the embodiments of the present invention, reference may be made to the specific description of the foregoing embodiments.

In the embodiments of the present invention, the digital signal is decoded according to the decoding protocol to generate decoding result information without relying on a hardware device for decoding, thereby improving decoding compatibility without changes in the hardware when a new protocol is used for decoding. In addition, the user does not need to know the protocol in detail to reduce the threshold for use of decoding.

Embodiment 4

Figure 10:
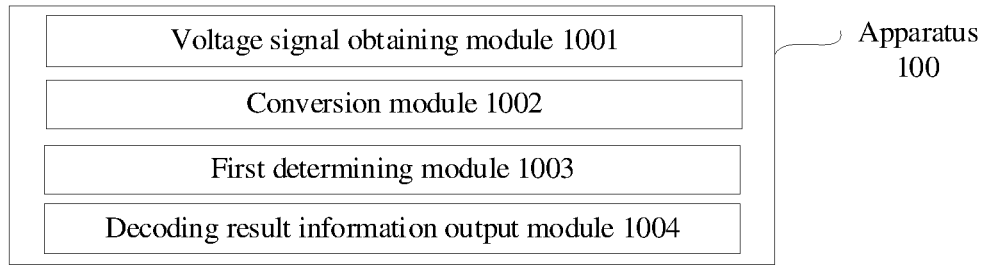
FIG. 10 is a schematic diagram of an apparatus for decoding an oscilloscope signal according to another embodiment of the present invention.

FIG. 10 is a schematic diagram of an apparatus for decoding an oscilloscope signal according to another embodiment of the present invention. An apparatus for decoding an oscilloscope signal provided in an embodiment of the present invention may be disposed in an oscilloscope.

Referring to FIG. 10, an apparatus 100 includes the following.

A voltage signal obtaining module 1001 is configured to obtain a voltage signal.

The voltage signal obtaining module 1001 is connected to a measured device to obtain the voltage signal. The voltage signal is an analog signal, and the voltage signal is a voltage that changes with time and may be represented as a waveform.

A conversion module 1002 is configured to convert the voltage signal into a digital signal.

A first determining module 1003 is configured to determine whether the digital signal matches a decoding protocol.

The decoding protocol may be any suitable protocol, for example, a CAN protocol, an SPI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol. The first determining module 1003 is specifically configured to: perform data format matching on the digital signal according to a decoding protocol to determine whether the digital signal matches the decoding protocol. The matching means that the digital signal completely matches the format of the decoding protocol.

A decoding result information output module 1004 is configured to decode the digital signal according to the decoding protocol and output decoding result information when the first determining module determines that the digital signal matches the decoding protocol.

When the first determining module 1003 determines that the digital signal matches the decoding protocol, the decoding result information output module 1004 may decode the digital signal according to the decoding protocol to generate decoding result information and output the decoding result information. The decoding result information may be composed of binary data, octal data or hexadecimal data.

The outputting, by the decoding result information output module 1004, the decoding result information may include: directly displaying the decoding result information on the oscilloscope; or sending the decoding result information to an external terminal device for display on the terminal device.

It should be noted that, in the embodiment of the present invention, the apparatus 100 for decoding the oscilloscope signal may perform the method for decoding the oscilloscope signal provided by Embodiment 2 of the present invention, and has corresponding function modules and beneficial effects for performing the method. For technical details not described in detail in the embodiment of the apparatus 100 for decoding the oscilloscope signal, reference may be made to the method for decoding the oscilloscope signal provided in Embodiment 2 of the present invention.

Embodiment 5

Figure 11:
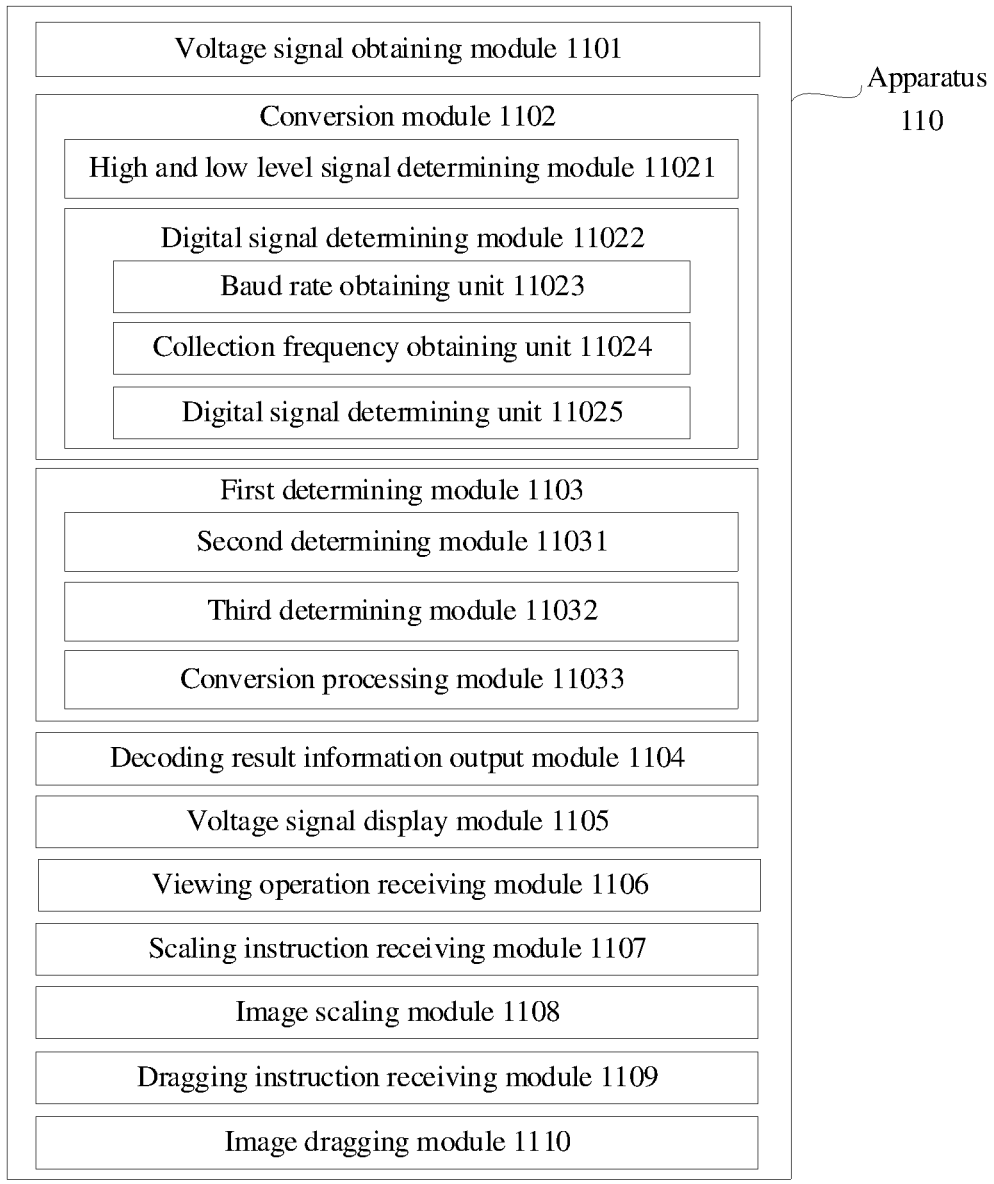
FIG. 11 is a schematic diagram of an apparatus for decoding an oscilloscope signal according to another embodiment of the present invention.

FIG. 11 is a schematic diagram of an apparatus for decoding an oscilloscope signal according to another embodiment of the present invention. An apparatus for decoding an oscilloscope signal provided in another embodiment of the present invention may be disposed in an oscilloscope.

Referring to FIG. 11, an apparatus 110 includes the following.

A voltage signal obtaining module 1101 is configured to obtain a voltage signal.

The voltage signal obtaining module 1101 is connected to a measured device to obtain the voltage signal. The voltage signal is an analog signal, and the voltage signal is a voltage that changes with time and may be represented as a waveform.

A conversion module 1102 is configured to convert the voltage signal into a digital signal.

The conversion module 1102 includes: a high and low level signal determining module 11021 configured to determine high and low level signals in the voltage signal according to a reference voltage; and a digital signal determining module 11022 configured to determine a digital signal according to the high and low level signals of the voltage signal. The reference voltage may be a user-defined voltage value. For example, a user input operation is received to obtain a reference voltage. In some embodiments, the reference voltage may further be a voltage value predefined by a system. The reference voltage is compared with all the data in the voltage signal to determine the high and low level signals in the voltage signal. For example, the reference voltage is 0 V, and the reference voltage is compared with all voltage values in the voltage signal. A voltage value less than 0 V is set as a low level signal, and a voltage value greater than 0 V is set as a high level signal. A value of the high level signal is represented by a number "1", and a value of the low level signal is represented by a number "0". The high and low level signals in the voltage signal are determined through the reference voltage, and amplitude values of each data point of the voltage signal may be converted into high and low levels, that is, "0" or "1".

Because the amount of data generated by the measured device per second and the amount of data collected by the oscilloscope per second may be inconsistent or differ considerably, when the two are inconsistent or differ considerably, there is a large amount of invalid duplicated data in data collected by the oscilloscope. Therefore, it is necessary to eliminate invalid data and obtain valid data, that is, necessary to obtain digital signals from high and low level signals of the voltage signal. The digital signal determining module 11022 includes: a baud rate obtaining unit 11023 configured to obtain a baud rate of a measured device; a collection frequency obtaining unit 11024 configured to obtain collection frequencies of the high and low level signals; and a digital signal determining unit 11025 configured to obtain the digital signal from the high and low level signals of the voltage signal according to the collection frequency and the baud rate. Further, the digital signal determining unit 11025 is specifically configured to: calculate a ratio of the collection frequency to the baud rate; and use, according to the ratio, a signal obtained through extraction from the high and low level signals at an equal interval as the digital signal.

A first determining module 1103 is configured to determine whether the digital signal matches a decoding protocol.

The decoding protocol includes, but is not limited to: a CAN protocol, an SPI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol. For example, the decoding protocol is the CAN protocol. The first determining module 1103 is specifically configured to: perform data format matching on the digital signal according to a decoding protocol to determine whether the digital signal matches the decoding protocol. The matching means that the digital signal completely matches the format of the decoding protocol. When the decoding protocol is the CAN protocol, the format of the decoding protocol may include, but is not limited to: a CAN standard frame format or a CAN extended frame format.

Further, the first determining module 1103 is specifically configured to: determine at least one data frame in the digital signal according to a format of a digital frame of the decoding protocol; check each of the at least one data frame; determine whether each data frame is checked successfully; and if so, determine that the digital signal matches the decoding protocol. The checking each of the at least one data frame includes, but is not limited to: obtaining DLC data in one data frame of the at least one data frame, and determine whether the DLC data is correct; obtaining a CRC field in one of the at least one data frame, and performing a CRC; obtaining an acknowledgement field in one of the at least one data frame, and performing an acknowledgement field check; and obtaining an end frame in one of the at least one data frame, and performing an end frame check. If the check is successful, it is determined that the digital signal matches the decoding protocol. If the check fails, a frame header of the data frame that fails to be checked is moved by one bit, and the step of determining at least one data frame in the digital signal according to a format of a digital frame of the decoding protocol is performed.

In some embodiments, the first determining module 1103 may include: a second determining module 11031 configured to determine whether the protocol is a CAN protocol; a third determining module 11032 configured to determine whether there are a plurality of consecutive bit values that are the same in the digital signal when the second determining module determines that the protocol is the CAN protocol; and an inversion processing module 11033 configured to perform bit value inversion processing on the digital signal when the third determining module determines that the plurality of consecutive bit values are the same in the digital signal.

When the first determining module 1103 includes the second determining module 11031, the third determining module 11032 and the inversion processing module 11033, the determining, by the first determining module 1103, at least one data frame in the digital signal according to a format of a digital frame of the decoding protocol specifically includes: determining at least one data frame in the processed digital signal according to a format of a digital frame of the decoding protocol.

A decoding result information output module 1104 is configured to decode the digital signal according to the decoding protocol and output decoding result information when the first determining module determines that the digital signal matches the decoding protocol.

When the first determining module 1103 determines that the digital signal matches the decoding protocol, the decoding result information output module 1104 may decode the digital signal according to the decoding protocol to generate decoding result information. The matching means that the digital signal completely matches the format of the decoding protocol. The decoding result information may be composed of binary data, octal data or hexadecimal data.

The decoding result information output module 1104 is specifically configured to display the decoding result information.

A voltage signal display module 1105 is configured to display the voltage signal.

A viewing operation receiving module 1106 is configured to receive a viewing operation on the voltage signal by a user.

Since each piece of the decoding result information has a corresponding time and amplitude, and the voltage signal is a time-domain signal, that is, the voltage changes with time, the decoding result information related to the voltage signal may be displayed through the decoding result information output module 1104. That is, the displaying, by the decoding result information output module 1104, the decoding result information includes: displaying the decoding result information corresponding to the viewing operation. Specifically, first, the voltage signal is displayed through the voltage signal display module 1105, and then a viewing operation on the voltage signal by a user is received through the viewing operation receiving module 1106. When the viewing operation is viewing decoding result information, the decoding result information corresponding to the viewing operation may be displayed on the oscilloscope, that is, the decoding result information is a mark performed on a waveform corresponding to the voltage signal.

A scaling instruction receiving module 1107 is configured to receive an image scaling instruction.

The scaling instruction receiving module 1107 may receive the image scaling instruction to scale a display image of a voltage signal and/or a display image of the decoding result information. The image scaling instruction may be generated based on an operation of the user.

An image scaling module 1108 is configured to scale the display image of the voltage signal and/or a display image of the decoding result information according to the image scaling instruction.

The image scaling module 1108 may scale, according to the image scaling instruction, the display image that is of the voltage signal and that is displayed on the oscilloscope and/or the display image of the decoding result information. The entire display image of the voltage signal and/or the display image of the decoding result information may be scaled, or a portion of the display image of the voltage signal and/or the display image of the decoding result information may be scaled. For example, a frame selection tool is provided, and the frame selection tool may be used to scale and display the display image during the corresponding time period selected by the frame. When the display image during the time period is displayed relatively intensively, the image scaling module 1108 may magnify the display image during the time period for easy observation according to the image scaling instruction. When the display image during the time period is displayed relatively loosely, the display image scaling module 1108 may reduce, according to the image scaling instruction, the display image during the time period to adjust the display image of the voltage signal and/or the display image of the decoding result information within a display range suitable for a user to observe.

A dragging instruction receiving module 1109 is configured to receive an image dragging instruction.

The dragging instruction receiving module 1109 may receive an image dragging instruction to drag the display image that is of the voltage signal and that is displayed on the oscilloscope and/or the display image of the decoding result information. The image dragging instruction may be generated based on an operation of the user.

An image dragging module 1110 is configured to drag the display image of the voltage signal and/or the display image of the decoding result information according to the image dragging instruction.

The image dragging module 1110 may drag, according to the image dragging instruction, the display image that is of the voltage signal and that is displayed on the oscilloscope and/or the display image of the decoding result information. The display image of the voltage signal and/or the display image of the decoding result information may be dragged left and right, or the display image of the voltage signal and/or the display image of the decoding result information may be dragged up and down. The display image of the voltage signal and/or the display image of the decoding result information are dragged, which is convenient for users to observe images in different time periods as required.

It should be noted that, in the embodiment of the present invention, the apparatus 110 for decoding the oscilloscope signal may perform the method for decoding the oscilloscope signal provided by Embodiment 3 of the present invention, and has corresponding function modules and beneficial effects for performing the method. For technical details not described in detail in the embodiment of the apparatus 110 for decoding the oscilloscope signal, reference may be made to the method for decoding the oscilloscope signal provided in Embodiment 3 of the present invention.

Embodiment 6

Figure 12:
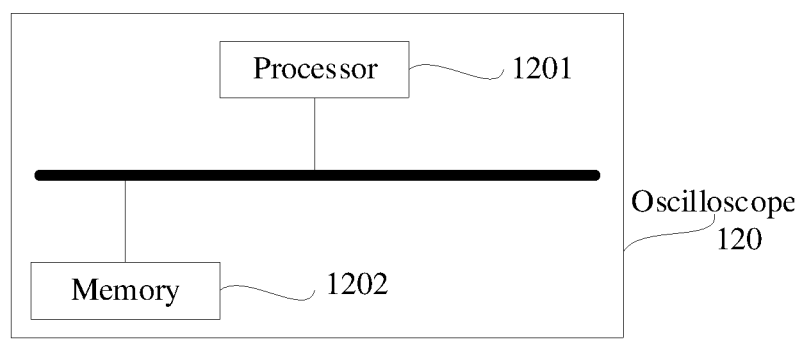
FIG. 12 is a schematic structural diagram of hardware of an oscilloscope according to an embodiment of the present invention.

FIG. 12 is a schematic structural diagram of hardware of an oscilloscope according to an embodiment of the present invention. As shown in FIG. 12, an oscilloscope 120 includes:

one or more processors 1201 and a memory 1202. One processor 1201 is used as an example in FIG. 12.

The processor 1201 and the memory 1202 may be connected through a bus or in other manners. In FIG. 12, that the processor and the memory are connected through a bus is used as an example.

As a non-volatile computer readable storage medium, the memory 1202 may be configured to store a non-volatile software program, a non-volatile computer executable program, and a module, for example, a program instruction/module (for example, the voltage signal obtaining module 1101, the conversion module 1102, the first determining module 1103, the decoding result information output module 1104, the voltage signal display module 1105, the viewing operation receiving module 1106, the scaling instruction receiving module 1107, the image scaling module 1108, the dragging instruction receiving module 1109 and the image dragging module 1110 that are shown in FIG. 11) corresponding to the method for decoding the oscilloscope signal provided in Embodiment 2 or Embodiment 3 of the present invention. The processor 1201 executes various functional applications and data processing of the oscilloscope by running a non-volatile software program, an instruction and a module stored in the memory 1202, that is, the method for decoding the oscilloscope signal provided in the Embodiment 2 or Embodiment 3 of the method is implemented.

The memory 1202 may include a program storage area and a data storage area, where the program storage area may store an operating system, an application required for at least one function, and the data storage area may store data and the like created according to use of the oscilloscope. In addition, the memory 1202 may include a high speed random access memory, and may further include a non-volatile memory, such as at least one magnetic disk storage device, a flash memory device, or other non-volatile solid state storage devices. In some embodiments, the memory 1202 may optionally include remotely located memories relative to the processor 1201, and these remote memories may be connected to the oscilloscope via a network. The embodiment of the network includes, but is not limited to, the Internet, an intranet, a local area network, a mobile communications network and a combination thereof.

The one or more modules are stored in the memory 1202. When executed by the one or more processors 1201, the one or more modules perform the method for decoding the oscilloscope signal provided in Embodiment 2 or Embodiment 3 of the present invention, for example, perform step 501 to step 510 in the foregoing method in FIG. 5, or implement functions of the modules 1101-1110 in FIG. 11.

For example, the oscilloscope 120 may further include a communication interface, the communication interface being configured to implement communication with a terminal device or other devices such as a server. Other apparatuses included in the oscilloscope 120 are not limited herein.

The oscilloscope may perform the method for decoding the oscilloscope signal provided in Embodiment 2 or Embodiment 3 of the present invention, and has corresponding function modules and beneficial effects for performing the method. For technical details not described in detail in the embodiment of the oscilloscope, reference may be made to the method for decoding the oscilloscope signal provided in Embodiment 2 or Embodiment 3 of the present invention.

An embodiment of the present invention provides a computer program product that includes a computer program stored on a non-volatile computer-readable storage medium. The computer program includes program instructions that, when executed by an oscilloscope, cause the oscilloscope to perform the method for decoding the oscilloscope signal provided in Embodiment 2 or Embodiment 3 of the present invention. For example, step 501 to step 510 in the foregoing method in FIG. 5 are performed, or functions of the modules 1101-1110 in FIG. 11 are implemented.

An embodiment of the present invention provides a non-volatile computer-readable storage medium. The computer-readable storage medium stores computer-executable instructions, which are used to cause an oscilloscope to perform the method for decoding the oscilloscope signal provided in Embodiment 2 or Embodiment 3 of the present invention. For example, step 501 to step 510 in the foregoing method in FIG. 5 are performed, or functions of the modules 1101-1110 in FIG. 11 are implemented.

It should be noted that, the apparatus embodiment described above is merely exemplary, and the modules described as separate components may or may not be physically separate, the components displayed as units may or may not be physical units, that is, may be located in one place, or may be distributed on a plurality of network units. Part or all of the modules may be selected according to actual needs to achieve the objective of the solution of this embodiment.

Through the description of the above embodiments, a person skilled in the art can clearly understand that the embodiments can be implemented by means of software plus a general hardware platform, and certainly, can also be implemented by hardware. A person of ordinary skill in the art can understand that all or part of the procedures in the method of the embodiment can be completed by computer program instructions related hardware. The program can be stored in a computer-readable storage medium, and when the program is executed, the procedure of the embodiment of each method may be included. The storage medium may be a magnetic disk, an optical disc, a read-only memory (ROM), or a random access memory (RAM).

Finally, it should be noted that: the above embodiments are only used to describe the technical solution of the present invention, but not limited thereto; under the thought of the present invention, the technical features in the above embodiments or different embodiments may also be combined. The steps can be implemented in any order, and there are many other variations of different aspects of the invention as described above, for brevity, they are not provided in the details; although the present invention is described in detail with reference to the foregoing embodiments, a person of ordinary skill in the art should understand that: it can still modify the technical solutions described in the foregoing embodiments, or equivalently replace some of the technical features; and these modifications or replacements do not deviate the spirit of the corresponding technical solutions from the implementation of the present invention.

What is claimed is:

1. A method for decoding an oscilloscope signal, wherein the method comprises:
   obtaining a voltage signal from a measured device, the measured device comprising an electronic control unit in a vehicle;
   converting the voltage signal into a digital signal;
   determining whether the digital signal matches a decoding protocol; and
   when the digital signal matches the decoding protocol, decoding the digital signal according to the decoding protocol into an image, and displaying the image for observation by an end-user;
   wherein the determining whether the digital signal matches the decoding protocol comprises:
   determining at least one data frame in the digital signal according to a format of a digital frame of the decoding protocol;
   checking each of the at least one data frame; and
   determining whether each data frame is checked successfully;
   when each data frame is checked successfully, the digital signal matching the decoding protocol is determined.

2. The method according to claim 1, wherein the converting the voltage signal into a digital signal comprises:
   determining high and low level signals in the voltage signal according to a reference voltage; and
   determining the digital signal according to the high and low level signals in the voltage signal.

3. The method according to claim 2, wherein the determining the digital signal according to the high and low level signals in the voltage signal comprises:

obtaining a baud rate of the measured device;
obtaining collection frequencies of the high and low level signals; and
obtaining the digital signal from the high and low level signals in the voltage signal according to a collection frequency of the collection frequencies and the baud rate.

4. The method according to claim 3, wherein the obtaining the digital signal from the high and low level signals in the voltage signal according to the collection frequency of the collection frequencies and the baud rate comprises:
calculating a ratio of the collection frequency of the collection frequencies to the baud rate; and
using, according to the ratio, a signal obtained through extraction from the high and low level signals at an equal interval as the digital signal.

5. The method according to claim 1, wherein the decoding protocol comprises any of a CAN protocol, an SRI protocol, an SD_SPI protocol, a UART protocol, an I2S protocol, an I2C protocol, a 1-Wire protocol, a LIN protocol, a FlexRay protocol, an ARINC429 protocol, a USB protocol, a DMX512 protocol and a DCC protocol.

6. The method according to claim 5, wherein if the decoding protocol is a CAN protocol, the determining whether the digital signal matches a decoding protocol further comprises:
if a plurality of consecutive bit values in the digital signal are same, performing bit value inversion processing on the digital signal;
the determining at least one data frame in the digital signal according to a format of a digital frame of the decoding protocol comprises:
determining at least one data frame in the processed digital signal according to the format of the digital frame of the decoding protocol.

7. The method according to claim 1, wherein the outputting decoding result information comprises:
displaying the decoding result information.

8. The method according to claim 7, wherein the method further comprises:
displaying the voltage signal;
receiving a viewing operation on the voltage signal by a user;
the displaying the decoding result information comprises:
displaying the decoding result information corresponding to the viewing operation.

9. An oscilloscope, comprising:
at least one processor; and
a memory communicably connected to the at least one processor, wherein
the memory stores instructions that may be executed by the at least one processor and that, when executed by the at least one processor, cause the at least one processor to execute the steps of:
obtaining a voltage signal from a measured device;
converting the voltage signal into a digital signal;
determining whether the digital signal matches a decoding protocol; and
when the digital signal matches the decoding protocol, decoding the digital signal according to the decoding protocol into an image, and displaying the image for observation by an end-user;
wherein the determining whether the digital signal matches a decoding protocol comprises:
determining at least one data frame in the digital signal according to a format of a digital frame of the decoding protocol;
checking each of the at least one data frame; and
determining whether each data frame is checked successfully
when each data frame is checked successfully, the digital signal matching the decoding protocol is determined.

\* \* \* \* \*